United States Patent [19]

Birkmaier et al.

[11] Patent Number: 4,505,786

[45] Date of Patent: * Mar. 19, 1985

[54] PRETREATMENT OF PLASTIC MATERIALS FOR METAL PLATING

[75] Inventors: Albert A. Birkmaier, Mendham; Gary A. Harpell, Morristown, both of N.J.; Bruce E. Kurtz, Marcellus, N.Y.; Gordhanbhai N. Patel, Camillus, N.Y.; Rustom P. Poncha, Syracuse, N.Y.; Adam L. Skovrinski, Memphis, N.Y.; James M. Lesco, Anaheim Hills, Calif.

[73] Assignee: Allied Corporation, Morris Township, Morris County, N.J.

[*] Notice: The portion of the term of this patent subsequent to Dec. 27, 2000 has been disclaimed.

[21] Appl. No.: 520,193

[22] Filed: Aug. 8, 1983

Related U.S. Application Data

[63] Continuation-in-part of Ser. No. 335,773, Dec. 30, 1981, Pat. No. 4,422,907.

[51] Int. Cl.$^3$ .............................................. C25D 5/56
[52] U.S. Cl. ................................................. 204/38.4
[58] Field of Search .......................... 204/38 B, 38.4; 427/299, 304, 305, 301, 306

[56] References Cited

U.S. PATENT DOCUMENTS 4,422,907 12/1983 Birkmaier et al. .

Primary Examiner—R. L. Andrews
Attorney, Agent, or Firm—Richard C. Stewart, II

[57] ABSTRACT

This invention relates to a process for conditioning the surfaces of natural and synthetic plastic materials for electroless plating of a metal coating thereon by exposing such materials to an atmosphere comprising an effective amount of ozone and thereafter contacting said exposed materials with an effective amount of a conditioning solvent, such as an aqueous solution of sodium, potassium or lithium hydroxide.

27 Claims, No Drawings

PRETREATMENT OF PLASTIC MATERIALS FOR METAL PLATING

CROSS-REFERENCE TO RELATED APPLICATIONS

This application is a continuation-in-part application of U.S. patent application Ser. No. 335,773 filed Dec. 30, 1981, now U.S. Pat. No. 4,422,907.

BACKGROUND OF THE INVENTION

1. Field of the Invention

This invention relates to a process for the conditioning of plastic materials and plastic articles which are to be metal plated through use of conventional electroless and electro plating techniques. More particularly, this invention relates to an improved process for surface conditioning of such plastic materials and plastic articles so as to provide them with hydrophilic surfaces. This conditioning permits electroless and electroplating of said materials and articles to provide metal plated surfaces which possess superior adhesive properties as compared to metal surfaces plated onto untreated surfaces. This invention also relates to products produced by the process of this invention.

2. Description of the Prior Art

In recent years, electroplating and metallic coating of plastics has become of ever increasing importance. In order to manufacture plastics having firmly bonded metal coatings, the plastic must be subjected to a pretreatment step, during which the surfaces of the plastic are treated to increase adhesion characteristics of metal surfaces coated thereon. Heretofore, various methods have been employed in such a pretreatment step. For example, in one such prior art method, the surfaces of the plastic are treated with a mixture of chromium trioxide, sulfuric acid and water, or a mixture of such ingredients and phosphoric acid. While relatively effective, this method suffers a number of disadvantages. For example, the efficiency of this method is very much dependent on the type of plastic to be treated; and accordingly it is mainly confined to use in the pretreatment of a narrow class of plastics. Thus, the process does not have universal applicability for a wide range of assorted plastics.

Another disadvantage of this known method is that the relative amounts of components in the chromium trioxide containing pre-treatment solution must be maintained within a pre-determined and rather narrow range of concentrations. Only deviations of a few percent from these optimum amounts are permissible. Otherwise, on subsequent chemical deposition of the metal, the plastic surface is not completely coated by the metal and/or the entire coating does not possess sufficiently high peel strength. In addition, in this known method, the pretreatment solution becomes useless as soon as the concentration levels of the degradation products of the plastic and of the trivalent chromium compounds in the solution reach a certain level. Thus, constant analytical supervision and dosing of the chemicals consumed and monitoring of the degradation products produced during the conduct of this known pretreatment method is required. This continual control of the process considerably complicates its conduct.

Still another disadvantage of this known pretreatment process results from difficulties associated with the disposal of the used composition. To eliminate the used pretreatment composition, it is necessary to reduce the hexavalent chromium compounds and then to neutralize the reduction product. In the neutralization procedure, large amounts of highly voluminous chromium hydroxide are formed, the removal of which considerably encumbers the disposal of the used composition. Thus, the disposal of the used pretreatment composition also complicates the conduct of the process and requires considerable expenditures of time, capital, technical apparatus and plants.

Lastly, the pretreatment composition of this known process is very corrosive, and extensive washings with water are required to completely remove it from the plastic surface being pretreated. The result is a further increase in process time and expense.

Another prior art process for pretreating plastic surfaces to enhance the peel strength of metal surfaces electroless or electroplated thereon is disclosed in U.S. Pat. No. 4,039,714. In this process, the surfaces of the plastic to be electroplated are pretreated by exposing them to an atmosphere containing sulfur trioxide. This known pretreatment process also suffers from several inherent disadvantages. For example, sulfur trioxide is an extremely toxic substance, which reacts with atmospheric moisture to form sulfuric acid which is extremely corrosive and dangerous. Thus, when using sulfur trioxide extreme care must be taken to prevent contact with human skin. Furthermore, sulfur trioxide reacts violently with certain organic materials producing heat, which results in an additional hazard to users of the process. The dangerous nature of sulfur trioxide results in an increase in the time, cost and equipment required to use this process. Lastly, cumbersome and costly ammonia neutralization of sulfur trioxide including disposal of the ammonium sulfate byproduct is also inherent to this etching process.

SUMMARY OF THE INVENTION

The present invention is directed to a method of treating plastic surfaces composed of polymeric materials to improve adhesion of a metal coating deposited upon said surfaces from an electroless plating bath, said method, comprising exposing said surfaces to an atmosphere comprising an effective amount of ozone, and thereafter contacting said surfaces with an effective amount of a "conditioning solvent". Polymer materials treated in accordance with the process of this invention are especially useful as the polymeric substrate in electroless plating processes. Such materials can be electroless plated immediately after pretreatment or at any time after pretreatment to provide uniformly metal coated plastic surfaces having exceptionally high adhesive properties as compared to metal coated plastic surfaces in which the polymeric substrate has not been pre-treated. Following the electroless plating procedure additional metal can be plated onto the resulting metal plated surfaces through use of conventional electroplating techniques.

One unique advantage of the ozone etch process as compared to conventional chromium trioxide etching process is the elimination of the possibility of cross contamination of hexavalent chromium which is experienced in conventional systems. This is critical in electroless systems because as little as 5 ppm of hexavalent chromium poisons electroless nickel solutions completely. Moreover, unlike the conventional chromic acid procedure, the process of this invention is ideal for foamed plastics because the ozone etch reaction is self terminating. Furthermore, because of diffusional effects only the surface of the foamed part is attacked by the ozone which minimizes the development of deep, open cells. A further advantage of the process of this invention is the alleviation of drainage problems between tanks and the cross contamination experienced in chrome systems where as many as 7-10 rinses are required after the hexavalent chromium etch step.

Such materials which have been pretreated and metal plated in accordance with this invention are useful for many purposes. For example, such metal plated plastics can be used for EMI/RFI shielding applications, for decorative purposes and/or for protection. Such metal plated plastics can also be used in the manufacture of printed circuit boards and to increase the strength and surface conductance of plastics. The process of this invention also provides parts which are considerably lighter than solid metal parts, yet which still possess metal conductive properties, metal surface characteristics and other like metal characteristics.

DETAILED DESCRIPTION OF THE INVENTION

The process of this invention includes two essential steps. In the first essential step, the surfaces of the plastic material to be pretreated are exposed to an atmosphere containing an "effective amount of ozone". As used herein, an "effective amount of ozone" is an amount of ozone which when contacted with the surfaces of a plastic material is effective to condition such surfaces such that subsequent treatment of said surfaces with an "effective amount of a conditioning solvent" (as hereinafter defined) followed by electroless plating of a metal thereon will provide a metal coating having enhanced adhesive properties as compared to the adhesive properties of metal coated onto untreated surfaces. While not intended to limit the scope of the invention in any way, it is believed that the ozone functions to etch the treated surfaces and render them hydrophilic. Normally, the greater the weight percent of ozone in the exposing atmosphere, the greater the degree of etching and the greater the increase in the hydrophilic character of the treated surfaces. Conversely, the less the amount of ozone in the exposing atmosphere, the less the degree of etching and the less the increase in the hydrophilic character of the treated surfaces. The quantity of ozone employed in a particular situation will depend on a number of factors, as for example the exposing temperature, the susceptibility of the particular plastic material to attack by ozone and the duration of exposure. Thus, variations in these parameters can greatly increase or decrease the speed and/or degree of etching and the extent to which the hydrophilic character of the plastic surfaces are modified; and thus, smaller or larger quantities of ozone can be employed depending on whether these operational parameters are maximized or minimized. In general, however, when employing preferred operational parameters, good results are achieved when the quantity of ozone is at least about 0.1 weight percent based on the total weight of gases in the exposing atmosphere surrounding the plastic surfaces being conditioned. In the preferred embodiments of this invention, the quantity of ozone which is employed is at least about 0.5 weight percent based on the total weight of gases in the atmosphere, and in the particularly preferred embodiments of this invention, the quantity of ozone is at least about 1.0 weight percent on the same basis. Amongst these particularly preferred embodiments, those in which the quantity of ozone is at least about 2.5 weight percent based on the total weight of gases are most preferred.

The upper weight percent of ozone is not critical, and best results would be achieved if an atmosphere composed of 100% ozone is employed. However, due to the economics of ozone generation and/or the difficulty inherent in the generation of atmospheres composed of more than about 30 weight percent ozone, atmospheres composed of higher amounts of ozone are normally not used.

As is apparent from the foregoing, the ozone containing atmosphere is not 100% ozone and will most often include one or more inert carrier gases. Preferably this carrier gas is oxygen. However, other gases may also be used for this purpose including air, nitrogen, carbon dioxide, noble gases, mixtures of the foregoing gases and other gases which meet the requirement of nonreactivity with ozone.

Process temperatures are not critical and can be varied as desired, provided, however, that the temperature is low enough to prevent substantial deformation of the plastic material being conditioned, and further provided that the temperature is high enough to allow favorable ozone on plastic reaction kinetics to occur. In addition, excessively elevated temperatures are preferably avoided so as to prevent or retard an unacceptably high reversion of ozone to oxygen. Because of these interacting phenomena, a strong relationship between ozonation temperatures, ozone concentrations and exposure time exists. When operating under preferred conditions, the process can be conveniently carried out at a temperature as low as about $-30°$ C. and lower, and up to a temperature of about 150° C. and higher depending on the particular plastic material being etched. The process is usually carried out at a temperature of between about 45° C. and about 100° C., and preferably from about 50° C. to about 90° C.

Process pressures are also not critical and can be varied widely. The process can be carried out at subatmospheric, atmospheric or super-atmospheric pressure. It is recognized, based on the principle of Le-Chatelier, that beneficial reaction characteristics can be brought about at super atmospheric pressures. However, the process is usually conducted at atmospheric or autogenous pressure for convenience.

In the first step of the process of this invention, the plastic material is exposed to the ozone atmosphere for a time sufficient to etch the surfaces of such material and to render them hydrophilic such that on subsequent treatment with strong base and electroless plating of metal thereon, the adhesion of the metal coating is improved to the extent desired. As was noted hereinabove, the duration of exposure will depend on a number of factors including, exposure temperatures, quantity of ozone in the exposing atmosphere and the like. Exposure times are not critical and can be varied over a wide range as desired provided that the aforementioned result is obtained. For example, exposure times can vary from about a few seconds up to about 24 hours or more. In most instances, however, exposure times will vary from about 1 to about 5 seconds up to about 1 to about 2 hours under the preferred process conditions, and these exposure times represent the preferred range of exposure times.

It should be appreciated that the preferred exposure time, exposure temperature and concentration of ozone in the exposing atmosphere for any particular application will depend on the type of plastic material being subjected to the process of this invention. Thus, the preferred set of process parameters for any particular application will preferably be selected in accordance with the chemical structure and reactivity of the plastic material in such a manner that optimum etching of the surface and changes in the hydrophilic character of the surface for a particular purpose is provided.

The plastic material selected for use in the process of this invention should contain functional groups which are susceptible to reaction with ozone, preferably those containing one or more unsaturated chemical bonds. Such materials include naturally occurring polymers, and plastics and other synthetic polymeric materials which may be thermoplastic, thermosetting and elastomeric polymers.

Illustrative of useful thermoplastic polymers are polyolefins, such as high or low density polyethylene, polypropylene, polyfluoroethylene, ethylene-propylene copolymers and the like; polysulfide; polyacetals; polyvinyl chloride and copolymers thereof; polyvinyl acetate, and the like; polysulfones; polystyrenes and acrylonitrile-butadiene-styrene copolymers and the like; polyamides, such as poly(hexamethylene adipamide), polycaprolactam, poly(hexamethylene sebacamide), poly(undecamide), and the like; polyphenylene oxide; saturated polyesters, such as polyalkolene terephthalate, and the like; polycarbonates; polyacrylic polymers, such as poly(methacrylate), polyacrylic acid, polyacrylonitrile, and the like; cellulose esters; and polyurethanes or polyamideimides. Exemplary of useful thermosetting polymers suitable for use in this invention are phenolic resins; aminoplastic; unsaturated polyesters; polyepoxides, and polyimides; and illustrative of useful elastomers are natural or synthetic rubbers, silicone rubbers, polyurethane elastomers and the like.

Preferred for use in the process of this invention are polymers containing carbon/oxygen double bonds, carbon/carbon triple bonds and carbon/carbon double bonds. Illustrative of such polymers are such as Nylon 66 (poly(hexamethylene adipamide)), Nylon 6 (polycaprolactam) and the like; polyacetylenes; polyisoprene; butadiene/styrene copolymer; polychloroprene; unsaturated polyesters; ABS (a block copolymer of acrylonitrile, butadiene and styrene); polybutadiene; and polyesters, such as poly(ethylene terephthalate). Also, preferred for use are polymers such as polysulfides, polyacetals, polysulfones, polyphenylene oxides and the like. Particularly preferred for use in the process of this invention are homo-polymers and, random, block and-/or graft copolymers which include recurring carbon/carbon double bonds such as acrylonitrile-butadiene-styrene copolymers, polybutadiene, polyisoprene, butadiene/sytrene copolymer, unsaturated polyesters, and like plastics having carbon/carbon double bonds in the polymer chain and polysulfides, polysulfones, polyacetals and polyphenylene oxides.

The method of producing the ozone containing atmosphere employed in the process of the present invention is not critical and conventional procedures may be employed. For example, the ozone component can be generated from air, providing a useful atmosphere composed of ozone and air. Ozone generators are commercially available in differing sizes ranging from small laboratory models to very large generators used in water treatment. Any of these conventional types of generators can be employed in the practice of this invention. Ozone generators are especially useful in the conduct of the process of this invention in that they are easily turned on and off to generate ozone as required, and thus, their use can prevent the generation of large quantities of excess ozone. Even though ozone has no reported long term toxic effects, and can be detected by smell at concentrations as low as 0.1 ppm, it is generally advisable not to produce large excesses of any chemical. In the event that large excesses are produced, the unused ozone can be catalytically reduced to oxygen with manganese dioxide or alumina to prevent any potential pollution problems.

In the second essential step of the process of this invention, the treated plastic surfaces are contacted with an "effective amount of a conditioning solvent". As used herein, an "effective amount of a conditioning solvent" is an amount of a solvent which when contacted with a plastic surface previously exposed to an effective amount of ozone is capable of removing the ozone/plastic degradation products from the ozone contacted surface to provide a treated surface on which a metal coating having improved peel strength can be deposited by conventional electroless plating techniques. Illustrative of useful conditioning solvents are solutions of "strong bases." As used herein "strong base" is a base which can form an aqueous solution having a pH of at least about 8, and preferably at least about 10. Exemplary of useful strong base solutions are solutions of alkali and alkaline earth metal hydroxides and alkoxides, as for example, sodium hydroxide, potassium hydroxide, lithium hydroxide, sodium methoxide, sodium ethoxide, and non-metal hydroxides as for example ammonium hydroxide in a solvent which can solvate the base and which is not reactive with such bases. Illustrative of useful nonreactive solvents are water and polar organic solvents such as ethyl acetate, ethanol, methanol, dimethyl formamide, dimethyl sulfoxide and the like. In the particularly preferred embodiments of this invention, an aqueous solution of a strong inorganic base, as for example, sodium hydroxide, lithium hydroxide, potassium hydroxide, ammonium hydroxide and the like is employed. The concentration of base in the solvent is preferably at least about 0.001 weight percent, and in the particularly preferred embodiments is in the range of from about 2 to about 30 weight percent based on the total weight of the solvent. Amongst these particularly preferred embodiments, solutions having a base content of from about 5 to about 10 weight percent on the same basis are most preferred.

After being subjected to the process of this invention, the metal surfaces are preferably washed with water to remove any conditioning solvent adhering to the treated plastic surfaces. The surfaces can then be electroless plated through use of conventional procedures, which may be followed by electroplating, also by conventional means to provide polymeric materials and polymeric articles having uniform and well adhering copper, brass, cadmium, chromium, nickel, gold, silver, platinum, zinc and like metal surface layers.

Polymeric materials treated in accordance with the process of this invention followed by conventional electroless plating, and optionally by electroplating, have many uses. For example, such plated surfaces can be used for EMI/RFI shielding on electronics housings as well as for decorative purposes. The metal surfaces also provide a protective covering against abrasion and the like. In addition, plastic materials metal plated in accordance with the process of this invention can be used in the manufacture of printed circuit boards. Such boards are flat plastic plates plated with metals such as copper and the like through use of conventional techniques.

EXAMPLES I TO XV

Plaques, 0.05 m×0.10 m×0.002 m, composed of acrylonitrile/butadiene/styrene copolymer, are placed into a 2 liter glass resin kettle, fitted with gas inlet and outlet orifices. Fitted to the gas inlet orifice is an ozone generator, manufactured by the Welsbach Corporation and sold under the Tradename Welsbach Laboratory Ozonator, Model T-23. A mixture containing about 2 weight percent ozone and the remainder oxygen is generated by the ozone generator and is fed at the rate of about 0.0017 $m^3$/min. into the resin kettle. Each plaque is exposed to the ozone atmosphere at varying temperatures for varying time periods. After exposure, each plaque is removed and some are subjected to treatment with approximately 1 weight percent aqueous sodium hydroxide solution.

The process parameters, and results of each experiment are set forth in the following TABLE I.

TABLE I

Treatment of ABS (Acrylonitrile, Butadine Styrene Copolymer

| Example | Detergent Wash Before Etching | NaOH Treatment After Etching | Ozone Treatment (mins) | Temp. °C. |
|---|---|---|---|---|
| I | Yes | Yes | 120 | 25 |
| II | Yes | Yes | 2 | 70 |
| III | No | Yes | 2 | 70 |
| IV | Yes | Yes | 5 | 70 |
| V | No | Yes | 5 | 70 |
| VI | Yes | Yes | 7 | 70 |
| VII | Yes | Yes | 10 | 70 |
| VIII | Yes | Yes | 2 | 80 |
| IX | No | Yes | 2 | 80 |
| X | Yes | Yes | 5 | 80 |
| XI | No | Yes | 5 | 80 |
| XII | Yes | Yes | 7 | 80 |
| XIII | Yes | Yes | 10 | 80 |
| XIV | Yes | Yes | 15 | 80 |

EXAMPLES XV TO XXVIII

Each of the plaques pretreated in Examples I to XIV is electroless plated as follows:

The plaque is dipped in an activator solution of (Macuplex Activator D-34, from MacDermid Inc. (aqueous solution containing palladium, stannous, stannic, and hydrogen chloride) at 28° C. for 2 minutes and rinsed for 1 minute in water. It is then dipped in an accelerator solution of HCl, stannic chloride and water (Macuplex D-45 Accelerator, MacDermid Inc.) at 50° C. and again rinsed in water for 1 minute. Each plaque is then placed in an electroless nickel plating bath. The nickel plating bath is prepared by mixing 440 ml of Enplate Ni-414A (Enthone Inc.) with 8 liters of DI water and then adding slowly 400 mL of Enplate Ni-414B (Enthone Inc.) solution with stirring. The resulting solution contains nickel chloride or nickel sulfide, ammonium hydroxide, sodium hypophosphite and water. The pH of the solution is adjusted to about 8.8–9 with ammonium hydroxide. The plaque is dipped in this bath for 7 to 10 minutes at room temperature followed by a 1 minute wash with water. The plaque is then fixed on a plating rack, dipped into a 5% $H_2SO_4$ solution and without rinsing is placed into a copper plating bath. The copper plating bath is prepared as follows: Anhydrous $CuSO_4$ (7.5 kg) are dissolved in 45 L of distilled water. To the solution is added 1775 mL of concentrated $H_2SO_4$ followed by 16 mL of concentrated HCl. To this solution is then added sequentially a mixture of 300 mL of Enthobrite Cu 10256W (Enthone Inc), 300 mL of water, 150 mL of Enthobrite Cu 10256 B (Enthone Inc), 10 mL of 10256 L (Enthone Inc) in 2 liters of water, and 25 mL 10256S (Enthone Inc). The plaque is plated at a current density of 0.03–0.05 amp per $cm^2$ for about 90 minutes. During electroless plating, the solution is circulated using a Sethco pump equipped with a filter.

After electroless plating each plaque employing the above described procedure, the peel strength of each metal coating was evaluated and the results are as set forth in the following Table II.

TABLE II

| Example | Treated Plaque | Peel Strength (kg/m) |
|---|---|---|
| XV | I | 0.45 |
| XVI | II | 0.14 |
| XVII | III | 0.11 |
| XVIII | IV | 0.23 |
| XIX | V | 0.11 |
| XX | VI | 0.23 |
| XXI | VII | 0.25 |
| XXII | VIII | 0.11 |
| XXIII | IX | 0.23 |
| XXIV | X | 0.30 |
| XXV | XI | 0.10 |
| XXVI | XII | 0.25 |
| XXVII | XIII | 0.30 |
| XXVIII | XIV | 0.31 |

EXAMPLE XXIX

A plaque composed of acrylonitrile-butadiene-styrene copolymer was etched by the conventional technique by treating the plaque with a chromic acid solution for about 7 minutes at a temperature of 63.° C. The plaque was then rinsed with DI water and placed in a neutralizer solution at 49° C. for 2 minutes. The plaque was again rinsed for 2 minutes with DI water, and was plated in accordance with the procedure of EXAMPLES XV TO XXVIII. The peel strength of the metal coating was about 0.34 to about 0.423 kg/m.

EXAMPLE XXX

A series of experiments were conducted to more particularly illustrate the criticality of treating the polymeric material with base after treatment with ozone. In these experiments, four plaques composed of ABS plastic were exposed to an atmosphere containing 1 weight percent ozone at 70° C. for ten minutes. After various treatments, each plaque was electroless plated in accordance with the procedure of EXAMPLES XV to XXVIII. The procedures employed in each treatment and the plating and peel strength of each plaque are set forth in the following TABLE III.

TABLE III

| PLAQUE NUMBER | TREATMENT AFTER ETCHING | PLATING AND PEEL STRENGTH (kg/m) |
|---|---|---|
| 1 | No treatment | No electroplating |
| 2 | Washed with water | No electroplating |
| 3 | Washed with 1% HCl | No electroplating |
| 4 | Washed with 1% NaOH | Excellent electroplating peel strength 0.282 kg/m. |

EXAMPLE XXX

With appropriate selection of plastic materials and other process parameters, a wide variety of such materials are treated and electroplated in accordance with the process of this invention to provide metal plated surfaces having enhanced peel strength. The process parameters of these illustrative embodiments are set forth in the following TABLE IV.

TABLE IV

| Plastic Material | Weight[1] Percent Base | Duration of Ozone Treatment (Mins.) | Weight Percent of Ozone | Temp. °C. | Peel Strength |
| --- | --- | --- | --- | --- | --- |
| polyethylene | .1% NaOH | 5 | 30.0 | 100 | Acceptable |
| polychloroprene | .5% KOH | 20 | 1.0 | 25 | Acceptable |
| polypropylene | 10% NH4OH | 90 | 2.0 | 60 | Acceptable |
| polyisoprene | 20% LiOH | 180 | 3.5 | 50 | Acceptable |
| polyvinyl chloride | 10% NaOH | 15 | .6 | 40 | Acceptable |
| butadiene/styrene copolymer | 5% KOH | 200 | .8 | 85 | Acceptable |
| polycaprolactam | 30% LiOH | 240 | 1.0 | 100 | Acceptable |
| poly(undecamide) | 5% NH4OH | 360 | .15 | 15 | Acceptable |
| polybutadiene | 25% NaOH | 10 | 2.2 | 25 | Acceptable |
| ABS | 15% KOH | 15 | 3.8 | 40 | Acceptable |
| polybutadiene | 2% NaOH | 90 | 3.5 | 85 | Acceptable |
| ABS | 19% NH4OH | 600 | .05 | 50 | Acceptable |
| polyacetylene | 25% NaOH | 100 | .8 | 90 | Acceptable |
| ABS | 35% KOH | 120 | .91 | 110 | Acceptable |
| polyisoprene | 30% NH4OH | 150 | 1.0 | 120 | Acceptable |
| polychloroprene | 25% KOH | 100 | 3.0 | 15 | Acceptable |
| acrylonitrile/butadiene copolymer | 1% NaOH | 50 | 4.5 | 0 | Acceptable |
| ABS | 8% NaOH | 90 | 3.2 | 5 | Acceptable |
| polybutadiene | 2% KOH | 120 | 4.0 | 65 | Acceptable |

[1] The remainder of the solution is water.

EXAMPLE XXXI

Samples of an acrylonitrile/butadiene/styrene copolymer manufactured and marketed by Borg Warner, Inc. under the trade designation Cyclolac® KJB are placed in a sealed reaction chamber. The chamber is equipped with direct contact heating and circulation capabilities. Gas inlet and outlet orifices are provided enabling the passage of a carrier gas capable of etching the copolymer. The etchant employed in this reaction is ozone. The ozone is produced using a generator manufactured by the Welsbach Corporation and sold under the tradename Welsbach Laboratory Ozonator, Model T-23. The carrier gas is allowed to flow through the chamber at a constant rate of about 800 cc/min. Heating and circulation are initiated to quickly elevate the reaction temperature to the desired level, e.g., 90° C. When the reaction temperature is established, circulation is discontinued and ozone is introduced. This is the beginning of the reaction and the concentration of ozone in the reactor is essentially zero. The reaction is allowed to continue for about 18 minutes. Circulation of the reactor gases is then reinitiated thus effecting a homogeneous ozone atmosphere having a final concentration of about 2.2 percent by weight. Ozone concentration is monitored using a model HC, PCI Ozone Corp. Ozone Analyzer. The reaction is complete after about 20 min. total elapsed time.

Following ozone exposure, the samples are treated with an aqueous NaOH solution having a concentration of about one percent by weight.

Subsequent treatment involves electroless plating techniques described as follows:

The samples are immersed in an activator solution of Macuplex Activator D-34, from MacDermid Inc. (aqueous solution containing palladium, stannous, stannic, and hydrogen chloride) at 28° C. for two minutes and rinsed for 1 minute in water. They are then immersed in an accelerator solution of Macuplex Accelerator D-45, from MacDermid Inc. (aqueous solution containing HCl and stannic chloride) at 50° C. for 2 minutes and again rinsed in water for 1 minute. The samples are then placed in an electroless copper plating bath. The copper bath is prepared by mixing 6% by volume Enplate Cu-750A (Enthone Inc.), 5% by volume Enplate Cu-750B (Enthone Inc.), 2.25% by volume Enplate Cu-750C (Enthone Inc.), and 0.5% by volume 37% formaldehyde. The samples are immersed in this bath for 15 minutes at 25° C. followed by a 1-minute rinse with water. Next, the samples are reactivated in an aqueous solution comprised of 1.5% by volume Enplate 440 (Enthone Inc.) and 1% by volume concentrated HCl. This is completed at 25° C. for about 5 minutes followed by a 1-minute rinse with water. Finally, the samples are placed in an electroless nickel plating bath which is prepared by mixing 6% by volume Enplate Ni-419A and 9% Enplate NI-419B, (Enthone Inc.). The pH of the solution is adjusted to about 8-8.9 with ammonium hydroxide. The samples are immersed in this bath for about 10 minutes at 25° C. followed by a 1-minute rinse with water.

The adhesion characteristics of electroless plate on the sample are then determined. A stringent test of adhesive quality particularly for EMI/RFI applications involves thermal cycling of the plated plastic. In these experiments, plated plastics have to survive at least three succesive −40° C. to +80° C. temperature cycles without blistering, cracking, peeling or incurring any other physical deterioration. Plated plastics were also subjected to a qualitative tape peel test. The plating was cross hatched with a razor blade and adhesive tape (Scotch Magic Tape 810) applied firmly to the cross hatched surface. The tape was peeled off rapidly and the amount of plating peeled off noted. An acceptable rating for plated plastic required that no metal be peeled off in this test.

EXAMPLE XXXII

Employing the procedure of Example XXXI, duplicate samples of an acrylonitrile/butadiene/styrene copolymer manufactured and marketed by Borg Warner, Inc. under the trade designation Cycolac® KJB are etched with ozone for a 5 min. period of time followed by treatment with a 1% aqueous solution of NaOH. Subsequent electroless nickel plating results in an acceptable plated plastic.

EXAMPLE XXXIII

Employing the procedure of Example XXXI duplicate samples of a polysulfone manufactured and marketed by Union Carbide Corporation under the trade designation Mindel® M are similarly etched with ozone and thereafter treated with 1% aqueous solution of NaOH. Subsequent electroless plating results in an acceptable plated plastic.

EXAMPLE XXXIV

Employing the procedure of Example XXXI, duplicate samples of a polyphenylene sulfide manufactured and sold by Phillips Petroleum Inc. under the trade designation Ryton®-10 are similarly etched with ozone and thereafter treated with 1% aqueous solution of NaOH. Subsequent electroless nickel plating results in an acceptable plated plastic.

EXAMPLE XXXV

Employing the procedure of Example XXXI, duplicate samples of a homopolymer of formaldehyde manufactured and marketed by Dupont under the trade designation Delrin® are similarly etched with ozone and thereafter treated with 1% aqueous solution of NaOH. Subsequent electroless nickel plating results in an acceptable plated plastic.

EXAMPLE XXXVI

Employing the procedure of Example XXXI, duplicate samples of a copolymer of trioxane and ethylene oxide manufactured and marketed by Celanese Inc. under the trade designation Celcon® are similarly etched with ozone and thereafter treated with 1% aqueous solution of NaOH. Subsequent electroless nickel plating results in an acceptable plated plastic.

EXAMPLE XXXVII

Employing the procedure of Example XXXI, duplicate samples of a copolymer of polyphenylene oxide and polystyrene manufactured and marketed by General Electric Inc. under the trade designation Noryl® 225 are similarly etched with ozone and thereafter treated with 1% aqueous solution of NaOH. Subsequent electroless nickel plating results in an acceptable plated plastic.

EXAMPLE XXXVIII

Employing the procedure of Example XXXI, duplicate samples of a copolymer of polyphenylene oxide and polystyrene manufactured and marketed by General Electric Inc. under the trade designation Noryl® 225 are similarly etched with ozone. Treatment with 1% aqueous NaOH for 10 minutes at 25° C. is eliminated. Subsequent electroless nickel plating results in an unacceptable plated plastic.

EXAMPLE XXXIX

Employing the procedure of Example XXXI, duplicate samples of a copolymer of polyphenylene oxide and polystyrene manufactured and marketed by General Electric Inc. under the trade designation Noryl® 225 are etched with ozone at a constant temperature of 120° C. The final concentration of the ozone atmosphere is about 1.4 percent by weight. Treatment with the 1% aqueous solution of NaOH is eliminated. Subsequent electroless nickel plating results in an unacceptable plated plastic.

EXAMPLE XL

Employing the procedure of Example XXXI, duplicate samples of a copolymer of polyphenylene oxide and polystyrene manufactured and marketed by General Electric Inc. under the trade designation Noryl® 225 are etched with ozone at a constant temperature of 75° C. The final concentration of the ozone atmosphere is about 2.4 percent by weight. Treatment with the 1% aqueous solution of NaOH is eliminated. Subsequent electroless nickel plating results in an unacceptable plated plastic.

EXAMPLE XLI

Employing the procedure of Example XXXI, duplicate samples of a copolymer of polyphenylene oxide and polystyrene manufactured and marketed by General Electric Inc. under the trade designation Noryl® 225 are etched with ozone at a constant temperature of 50° C. The final concentration of the ozone atmosphere is about 2.5 percent by weight. Treatment with the 1% aqueous solution of NaOH is eliminated. Subsequent electroless nickel plating results in an unacceptable plated plastic.

What is claimed is:

1. In an improved process for metal plating a natural or synthetic plastic material by conditioning said material to improve metal adhesion and depositing a metal coating upon said conditioned surface from an electroless plating bath, wherein said improvement comprises a conditioning step in which said material is exposed to an atmosphere comprising an effective amount of ozone and is then contacted with an effective amount of a conditioning solvent.

2. A process according to claim 1 wherein said material is selected from the group consisting of polydiphenylene sulfones, polyacetals, polyphenylene sulfides and polyphenylene oxides.

3. A process according to claim 2 wherein said material is a polydiphenylene sulfone.

4. A process according to claim 2 wherein said material is polyphenylene sulfide.

5. A process according to claim 2 wherein said material is polyphenylene oxide.

6. A process according to claim 2 wherein said material is a polyacetal.

7. An improved process according to claim 2 wherein the quantity of ozone in said atmosphere is at least about 0.1 weight percent based on the total weight of the atmosphere.

8. An improved process according to claim 7 wherein said quantity is at least about 0.5 weight percent.

9. An improved process according to claim 8 wherein said quantity is at least about 0.8 weight percent.

10. An improved process according to claim 9 wherein said quantity is at least about 2.5 weight percent.

11. An improved process according to claim 2 wherein said conditioning solvent comprises a solution of one or more strong organic or inorganic bases.

12. An improved process according to claim 11 wherein said bases are selected from the group consisting of strong inorganic bases.

13. An improved process according to claim 12 wherein said exposed material is contacted with an aqueous solution containing an effective amount of said strong inorganic base.

14. An improved process according to claim 13 wherein said base is selected from the group consisting of sodium hydroxide, lithium hydroxide, potassium hydroxide and ammonium hydroxide.

15. An improved process according to claim 11 wherein the concentration of base in said solution is at least about 0.001 weight percent based on the total weight of the solution.

16. An improved process according to claim 15 wherein said concentration is from about 0.5 to about 50 weight percent.

17. An improved process according to claim 16 wherein said concentration is from about 1 to about 50 weight percent.

18. An improved process according to claim 17 wherein said concentration is from about 5 to about 10 weight percent.

19. An improved process for plating one or more metal onto the surfaces of a plastic material which comprises:
(a) exposing said material to an atmosphere containing an effective amount of ozone;
(b) contacting said exposed material with an effective amount of a conditioning solvent;
(c) coating said contacted material with a catalyst for electroless plating of metal thereon; and
(d) depositing a metal coating on said catalyzed material by electroless plating.

20. An improved process according to claim 19 wherein said metal is selected from the group consisting of copper, silver, nickel and cobalt.

21. An improved process according to claim 20 which further comprises depositing one or more additional metal coatings onto said metal coated material of step d, by electroplating.

22. An improved process according to claim 21 wherein said one or more additional metals are selected from the group consisting of copper, nickel, silver and chromium.

23. A process according to claim 2 wherein said ozone exposure temperature is from about $-30°$ C. to about $120°$ C.

24. A process according to claim 23 wherein said temperature is from about $45°$ C. to about $100°$ C.

25. A process according to claim 24 wherein said temperature is from about $50°$ C. to about $90°$ C.

26. A natural or synthetic material which has been conditioned in accordance with the process of claim 1.

27. A metal plated natural or synthetic plastic material one or more surfaces of which have been metal plated in accordance with the process of claim 19.

* * * * *